US007015168B2

(12) United States Patent
Aronowitz et al.

(10) Patent No.: US 7,015,168 B2
(45) Date of Patent: Mar. 21, 2006

(54) LOW DIELECTRIC CONSTANT FLUORINE AND CARBON-CONTAINING SILICON OXIDE DIELECTRIC MATERIAL CHARACTERIZED BY IMPROVED RESISTANCE TO OXIDATION

(75) Inventors: Sheldon Aronowitz, San Jose, CA (US); Vladimir Zubkov, Mountain View, CA (US)

(73) Assignee: LSI Logic Corporation, Milpitas, CA (US)

(*) Notice: Subject to any disclaimer, the term of this patent is extended or adjusted under 35 U.S.C. 154(b) by 117 days.

(21) Appl. No.: 10/652,007

(22) Filed: Aug. 29, 2003

(65) Prior Publication Data

US 2005/0098856 A1    May 12, 2005

Related U.S. Application Data

(62) Division of application No. 09/792,691, filed on Feb. 23, 2001, now Pat. No. 6,649,219.

(51) Int. Cl.
*C04B 35/14* (2006.01)
*H01L 21/31* (2006.01)
*H01L 23/58* (2006.01)

(52) U.S. Cl. .................... 501/133; 501/151; 257/632; 257/646

(58) Field of Classification Search ................ 501/133, 501/103, 151; 257/632, 646
See application file for complete search history.

(56) References Cited

U.S. PATENT DOCUMENTS 3,012,861 A    12/1961 Ling .......................... 23/223.5

(Continued)

FOREIGN PATENT DOCUMENTS

DE    198 04 375 A1    7/1999

(Continued)

OTHER PUBLICATIONS

Bothra, S., et al., "Integration of 0.25 $\mu$m Three and Five Level Interconnect System for High Performance ASIC", *1997 Proceedings Fourteenth International VMIC Conference*, Santa Clara, CA, Jun. 10-12, 1997, pp. 43-48.

(Continued)

*Primary Examiner*—Karl Group
(74) *Attorney, Agent, or Firm*—John P. Taylor

(57) ABSTRACT

The invention provides a process for forming a low k fluorine and carbon-containing silicon oxide dielectric material by reacting with an oxidizing agent one or more silanes containing one or more organofluoro silanes having the formula $SiR_1R_2R_3R_4$, where: (a) $R_1$ is selected from H, a 3 to 10 carbon alkyl, and an alkoxy; (b) $R_2$ contains at least one C atom bonded to at least one F atom, and no aliphatic C—H bonds; and (c) $R_3$ and $R_4$ are selected from H, alkyl, alkoxy, a moiety containing at least one C atom bonded to at least one F atom, and $((L)Si(R_5)(R_6))_n(R_7)$; where n ranges from 1 to 10; L is O or $CFR_8$; each n $R_5$ and $R_6$ is selected from H, alkyl, alkoxy, and a moiety containing at least one C atom bonded to at least one F atom; $R_7$ is selected from H, alkyl, alkoxy, and a moiety containing at least one C atom bonded to at least one F atom; and each $R_8$ is selected from H, alkyl, alkoxy, and a moiety containing at least one C atom bonded to at least one F atom. Also provided is a low dielectric constant fluorine and carbon-doped silicon oxide dielectric material for use in an integrated circuit structure which contains: silicon atoms bonded to oxygen atoms; silicon atoms bonded to carbon atoms; and carbon atoms bonded to fluorine atoms; where the dielectric material also has a characteristic selected from: (a) the presence of at least one C—C bond; (b) the presence of at least one carbon atom bonded to from 1 to 2 fluorine atoms; and (c) the presence of at least one silicon atom bonded to from 0 to 2 oxygen atoms.

12 Claims, 2 Drawing Sheets

U.S. PATENT DOCUMENTS

| | | | |
|---|---|---|---|
| 3,178,392 A | 4/1965 | Kriner | 260/46.5 |
| 3,652,331 A | 3/1972 | Yamazaki | 117/201 |
| 3,832,202 A | 8/1974 | Ritchie | 106/287 |
| 3,920,865 A | 11/1975 | Läufer et al. | 427/220 |
| 4,705,725 A | 11/1987 | Glajch et al. | 428/405 |
| 4,771,328 A | 9/1988 | Malaviya et al. | 357/49 |
| 5,152,819 A | 10/1992 | Blackwell et al. | |
| 5,194,333 A | 3/1993 | Ohnaka et al. | 428/405 |
| 5,314,845 A | 5/1994 | Lee et al. | 437/238 |
| 5,364,800 A | 11/1994 | Joyner | 437/28 |
| 5,376,595 A | 12/1994 | Zupancic et al. | 501/12 |
| 5,470,801 A | 11/1995 | Kapoor et al. | 437/238 |
| 5,558,718 A | 9/1996 | Leung | 118/723 E |
| 5,559,367 A | 9/1996 | Cohen et al. | 257/77 |
| 5,571,571 A * | 11/1996 | Musaka et al. | 427/574 |
| 5,571,576 A * | 11/1996 | Qian et al. | 427/574 |
| 5,580,429 A | 12/1996 | Chan et al. | 204/192.38 |
| 5,628,871 A | 5/1997 | Shinagawa | 438/514 |
| 5,675,187 A | 10/1997 | Numata et al. | 257/758 |
| 5,688,724 A | 11/1997 | Yoon et al. | 437/235 |
| 5,858,879 A | 1/1999 | Chao et al. | 438/725 |
| 5,864,172 A | 1/1999 | Kapoor et al. | 257/634 |
| 5,874,367 A | 2/1999 | Dobson | 438/787 |
| 5,874,745 A | 2/1999 | Kuo | 257/59 |
| 5,879,649 A | 3/1999 | Henderson et al. | |
| 5,882,489 A | 3/1999 | Bersin et al. | 204/192.35 |
| 5,904,154 A | 5/1999 | Chien et al. | 134/1.2 |
| 5,915,203 A | 6/1999 | Sengupta et al. | 438/669 |
| 5,939,763 A | 8/1999 | Hao et al. | 257/411 |
| 6,000,339 A * | 12/1999 | Matsuzawa | 106/287.14 |
| 6,020,458 A | 2/2000 | Lee et al. | |
| 6,025,263 A | 2/2000 | Tsai et al. | 438/624 |
| 6,028,015 A | 2/2000 | Wang et al. | 438/789 |
| 6,037,248 A | 3/2000 | Ahn | 438/619 |
| 6,043,167 A * | 3/2000 | Lee et al. | 438/789 |
| 6,051,073 A | 4/2000 | Chu et al. | 118/723 |
| 6,051,477 A | 4/2000 | Nam | 438/404 |
| 6,066,574 A | 5/2000 | You et al. | 438/781 |
| 6,114,259 A | 9/2000 | Sukharev et al. | 438/789 |
| 6,121,164 A * | 9/2000 | Yieh et al. | 438/790 |
| 6,147,012 A | 11/2000 | Sukharev et al. | 438/787 |
| 6,153,524 A | 11/2000 | Henley et al. | 438/691 |
| 6,204,192 B1 | 3/2001 | Zhao et al. | 438/723 |
| 6,232,658 B1 | 5/2001 | Catabay et al. | 257/701 |
| 6,303,047 B1 | 10/2001 | Aronowitz et al. | 252/1 |
| 6,365,528 B1 * | 4/2002 | Sukharev et al. | 438/778 |
| 6,413,583 B1 * | 7/2002 | Moghadam et al. | 427/249.15 |
| 6,508,997 B1 | 1/2003 | Choate et al. | |
| 6,511,925 B1 | 1/2003 | Aronowitz et al. | 438/788 |
| 6,858,195 B1 * | 2/2005 | Aronowitz et al. | 423/337 |
| 2003/0162034 A1 * | 8/2003 | O'Neill et al. | 428/426 |

FOREIGN PATENT DOCUMENTS

| | | | |
|---|---|---|---|
| EP | 0517548 | * | 9/1992 |
| EP | 0 706 216 A2 | | 4/1996 |
| EP | 0 949 663 A2 | | 10/1999 |
| JP | 63003437 | | 1/1988 |
| JP | 8-218170 | * | 2/1995 |
| JP | 09-008031 | * | 1/1997 |
| JP | 9-8031 | * | 1/1997 |
| JP | 2000-267128 | | 9/2000 |
| WO | WO 99/41423 | | 8/1999 |

OTHER PUBLICATIONS

Dobson, C.D., et al., "Advanced $SiO_2$, Planarization Using Silane and $H_2O_2$", *Semiconductor International*, Dec. 1994, pp. 85-88.

McClatchie, S., et al., "Low Dielectric Constant Oxide Films Deposited Using CVD Techniques", *1998 Proceedings Fourth International DUMIC Conference*, Feb. 16-17, 1998, pp. 311-318.

Nguyen, S. et al., "Reaction Mechanisms of Plasma- and Thermal-Assisted Chemical Vapor Deposition of Tetraethylorthosilicate Oxide Films", *J. Electrochem. Soc.*, vol. 137, No. 7, Jul., 1990, pp. 2209-2215.

Peters, Laura, "Low-k Dielectrics: Will Spin-On or CVD Prevail?", *Semiconductor International*, vol. 23, No. 6, Jun., 2000, pp. 108-110, 114, 116, 118, 122, and 124.

Peters, Laura, "Pursuing the Perfect Low-k Dielectric", *Semiconductor International*, vol. 21, No. 10, Sep., 1998, pp. 64-66, 68, 70, 72, and 74.

Sugahara, Satoshi, et al., "Chemical Vapor Deposition of $CF_3$-Incorporated Silica Films for Interlayer Dielectric Application", 1999 Joint International Meeting, *Electrochemical Society Meeting Abstracts*, vol. 99-2, 1999, Abstract No. 746.

Koda, Seiichiro, et al., "A Study of Inhibition Effects for Silane Combustion by Additive Gases", *Combustion and Flame*, vol. 73, No. 2, Aug., 1988, pp. 187-194.

* cited by examiner

```
┌─────────────────────────────────────────┐
│ PROVIDING A SEMICONDUCTOR SUBSTRATE IN  │
│ A CVD REACTOR ON A SUBSTRATE SUPPORT    │
│ CAPABLE OF MAINTAINING THE SUBSTRATE    │
│ AT A TEMPERATURE NOT EXCEEDING ABOUT    │
│ 25°C DURING FORMATION OF FLUORINE AND   │
│ CARBON-CONTAINING SILICON OXIDE         │
│ DIELECTRIC MATERIAL                     │
└─────────────────────────────────────────┘
                    │
┌─────────────────────────────────────────┐
│ INTRODUCING INTO THE CVD REACTOR A      │
│ VAPOROUS SOURCE OF PEROXIDE AND A       │
│ VAPOROUS ORGANOFLUORO SILANE            │
└─────────────────────────────────────────┘
                    │
┌─────────────────────────────────────────┐
│ DEPOSITING ON THE SUBSTRATE IN THE CVD  │
│ REACTOR A LOW K FILM OF FLUORINE AND    │
│ CARBON-CONTAINING SILICON OXIDE         │
│ DIELECTRIC MATERIAL CHARACTERIZED BY    │
│ IMPROVED RESISTANCE TO OXIDATION        │
└─────────────────────────────────────────┘
```

FIGURE 1

LOW DIELECTRIC CONSTANT FLUORINE AND CARBON-CONTAINING SILICON OXIDE DIELECTRIC MATERIAL CHARACTERIZED BY IMPROVED RESISTANCE TO OXIDATION

CROSS REFERENCE TO RELATED APPLICATIONS

This application is a division of U.S. patent application Ser. No. 09/792,691 filed Feb. 23, 2001, now U.S. Pat. No. 6,649,219 B2, issued Nov. 18, 2003.

The subject matter of this application relates to the subject matter of copending application Ser. No. 09/792,683, entitled "A PROCESS FOR FORMING A LOW DIELECTRIC CONSTANT FLUORINE AND CARBON-CONTAINING SILICON OXIDE DIELECTRIC MATERIAL CHARACTERIZED BY IMPROVED RESISTANCE TO OXIDATION", assigned to the assignee of this application, and filed on the same date as this application.

The subject matter of this application relates to the subject matter of copending application Ser. No. 09/792,685, entitled "A PROCESS FOR FORMING A LOW DIELECTRIC CONSTANT FLUORINE AND CARBON-CONTAINING SILICON OXIDE DIELECTRIC MATERIAL CHARACTERIZED BY IMPROVED RESISTANCE TO OXIDATION", assigned to the assignee of this application, and filed on the same date as this application.

The subject matter of this application relates to the subject matter of copending U.S. patent application Ser. No. 09/590,310, filed on Jun. 7, 2000, entitled "A LOW TEMPERATURE PROCESS FOR FORMING A LOW DIELECTRIC CONSTANT FLUORINE AND CARBON-CONTAINING SILICON OXIDE DIELECTRIC MATERIAL CHARACTERIZED BY IMPROVED RESISTANCE TO OXIDATION AND GOOD GAP-FILLING CAPABILITIES", and assigned to the assignee of this application.

BACKGROUND OF THE INVENTION

1. Field of the Invention

This invention relates to integrated circuit structures. More particularly this invention relates to the formation of a low dielectric constant (k) fluorine and carbon-containing silicon oxide dielectric material for use in the formation of integrated circuit structures.

2. Description of the Related Art

The shrinking of integrated circuits has resulted in levels of electrically conductive interconnects being placed closer together vertically, as well as reduction of the horizontal spacing between the electrically conductive interconnects, such as metal lines, on any particular level of such interconnects. As a result, capacitance has increased between such conductive portions, resulting in loss of speed and increased cross-talk. One proposed approach to solving this problem of high capacitance is to replace the conventional silicon oxide ($SiO_2$) dielectric material, having a dielectric constant (k) of about 4.0, with another insulation material having a lower dielectric constant to thereby lower the capacitance.

Dobson et al., in an article entitled "Advanced $SiO_2$ Planarization Using Silane and $H_2O_2$", published in Semiconductor International, December 1994, at pages 85–88, describe the low temperature formation of $SiO_2$ by reaction of silane ($SiH_4$) with hydrogen peroxide ($H_2O_2$) to produce a silicon oxide which flows like a liquid and thus exhibits good gap fill characteristics.

In an article by L. Peters, entitled "Pursuing the Perfect Low-K Dielectric", published in Semiconductor International, Volume 21, No. 10, September 1998, at pages 64–74, a number of alternate dielectric materials are disclosed and discussed. Included in these dielectric materials is a description of a low k dielectric material having a dielectric constant of about 3.0 formed using a Flowfill chemical vapor deposition (CVD) process developed by Trikon Technologies of Newport, Gwent, U.K. The process is said to react methyl silane ($CH_3$—$SiH_3$) with hydrogen peroxide ($H_2O_2$) to form monosilicic acid which condenses on a cool wafer and is converted into an amorphous methyl-doped silicon oxide which is annealed at 400° C. to remove moisture. The article goes on to state that beyond methyl silane, studies show a possible k of 2.75 using dimethyl silane in the Flowfill process.

An article by S. McClatchie et al. entitled "Low Dielectric Constant Oxide Films Deposited Using CVD Techniques", published in the 1998 Proceedings of the Fourth International Dielectrics For ULSI Multilevel Interconnection Conference (Dumic) held on Feb. 16–17, 1998 at Santa Clara, Calif., at pages 311–318, also describes the formation of methyl-doped silicon oxide by the low-k Flowfill process of reacting methyl silane with $H_2O_2$ to achieve a dielectric constant of ~2.9.

The incorporation of such carbon-doped silicon oxide dielectric material into interconnect architecture has been very attractive not only because of the low k properties, but also because of the compatibility with conventional silicon process technologies. Generally these materials remain stable upon annealing at temperatures of up to 500° C. The carbon doped silicon oxide materials are characterized by the structure of amorphous silicon oxide with incorporated methyl groups and hydrogen species, and are also characterized by a reduced density in comparison with conventional silicon oxide that can be explained by the formation of microporosity surrounding the incorporated methyl groups. Furthermore, such hydrocarbon-modified silicon oxide dielectric materials deposited by CVD techniques are also characterized by strong adhesion.

While such carbon-doped silicon oxide dielectric materials do exhibit the desired low k (i.e., dielectric constants below about 3.0), resulting in reduced capacitance of the dielectric material, a major problem of such carbon-doped silicon oxide is a low resistance to oxidation during subsequent processing steps that results in a destruction of the incorporated hydrocarbons and a resulting increase in the overall dielectric constant of the dielectric material. The sensitivity to oxidation is thought to be due to the reactivity of the C—H bonds of the methyl group bonded to silicon. The unintended removal of the methyl group results in a more hydrophilic surface that may be responsible for a so-called "via poisoning" which is observed after via etch and photoresist strip with oxygen-containing plasma, and is related to suppression of the surface nucleation in subsequent via liner deposition steps.

More recently, Sugahara et al., in an article entitled "Chemical Vapor Deposition of $CF_3$-Incorporated Silica Films for Interlayer Dielectric Applications", published in the 1999 Joint International Meeting, Electrochemical Society Meeting Abstracts, volume 99-2, Abstract 746, 1999, described the reaction of trimethyl-fluoromethyl-silane ($CF_3Si(CH_3)_3$) with an ozone oxidizer at an elevated temperature. Sugahara et al. stated that the low reactivity of Si-alkyl bonds required the deposition to be carried at elevated temperatures (~350° C.). The dielectric material formed by the reaction demonstrated resistance to oxidation by oxygen plasma. However, the precursor compound used by Sugahara yielded only approximately 15% $CF_3$ content in the product dielectric layer. Further, it is known that dielectric films produced by high temperature ozone processes are characterized by poor gap-fill, while continuous shrinkage in feature size of integrated circuit structure demands an increased gap-fill capability.

It would, therefore, be desirable to provide a process for forming a low k silicon oxide dielectric material using precursor compounds that can provide greater control of the amount of organofluoro moieties incorporated into the dielectric material. It would also be desirable to provide, in at least one embodiment, a low k silicon oxide dielectric material which exhibits the gap-fill properties and film adherence properties of CVD-formed low k carbon doped silicon oxide dielectric materials such as discussed by the Dobson et al., Peters, and McClatchie et al. articles discussed above, while also maintaining a low formation temperature to conserve the thermal budget of the integrated circuit structure. This invention provides these characteristics and provides additional advantages as well.

SUMMARY OF THE INVENTION

The invention provides a process for forming a low dielectric constant fluorine and carbon-containing silicon oxide dielectric material by reacting with an oxidizing agent one or more silanes comprising one or more organofluoro silanes having the formula $SiR_1R_2R_3R_4$, where: (a) $R_1$ is selected from H, a 3 to 5 carbon organo moiety, and an oxyorgano moiety; (b) $R_2$ is an organofluoro moiety; and (c) $R_3$ and $R_4$ are independently selected from the same or different leaving group, the same or different organofluoro moiety, and the same or different $((L)Si(R_5)(R_6))_n(R_7)$; where n ranges from 1 to 5; L is O or $(C(R_8)_2)_m$; m ranges from 1 to 4; each of the n $R_5$'s and n $R_6$'s is independently selected from the same or different leaving group and the same or different organofluoro moiety; $R_7$ is selected from a leaving group and an organofluoro moiety; and each of the 2n*m or fewer $R_8$'s is selected from F and the same or different organofluoro moiety.

The invention also provides a low dielectric constant fluorine and carbon-doped silicon oxide dielectric material for use in an integrated circuit structure comprising: silicon atoms bonded to oxygen atoms; silicon atoms bonded to carbon atoms; and carbon atoms bonded to fluorine atoms; where the dielectric material also has a characteristic selected from: (a) the presence of at least one C—C bond; (b) the presence of at least one carbon atom bonded to from 1 to 2 fluorine atoms; and (c) the presence of at least one silicon atom bonded to from 0 to 2 oxygen atoms.

BRIEF DESCRIPTION OF THE DRAWINGS

FIG. 1 is a flowsheet illustrating a process of the invention by reacting, at low temperature, hydrogen peroxide with an organofluoro silane to form a low k film of fluorine and carbon-containing silicon oxide dielectric material.

DETAILED DESCRIPTION OF THE INVENTION

Figure 2:
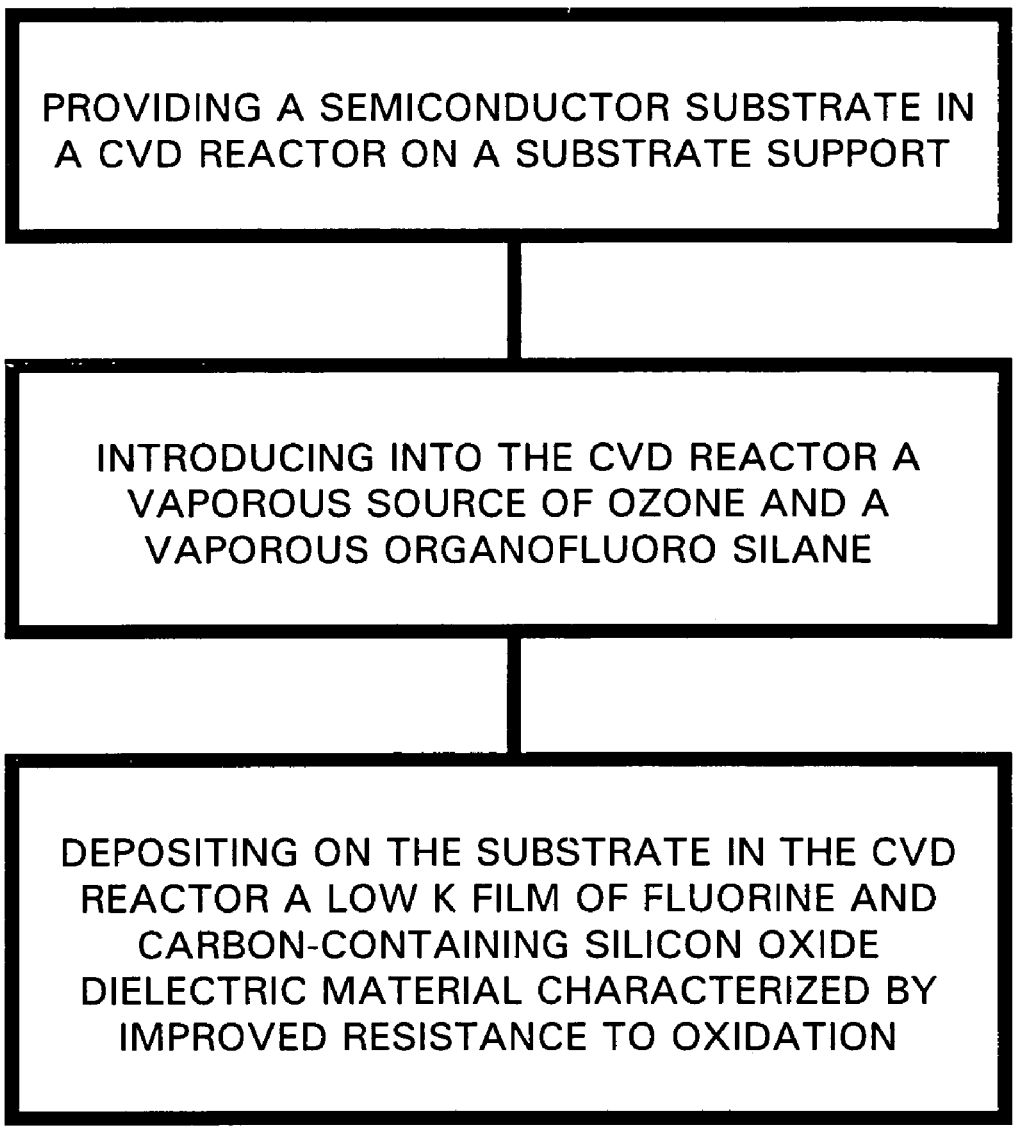
FIG. 2 is a flowsheet illustrating a process of the invention by reacting ozone with an organofluoro silane to form a low k film of fluorine and carbon-containing silicon oxide dielectric material.

The invention provides a process for forming a low dielectric constant fluorine and carbon-containing silicon oxide dielectric material by reacting with an oxidizing agent one or more silanes which include one or more organofluoro silanes having the formula $SiR_1R_2R_3R_4$, where: $R_1$ is selected from H, a 3 to 5 carbon organo moiety, and an oxyorgano moiety; $R_2$ is an organofluoro moiety; and $R_3$ and $R_4$ are independently selected from the same or different leaving group, the same or different organofluoro moiety, and the same or different $((L)Si(R_5)(R_6))_n(R_7)$; where n ranges from 1 to 5; L is O or $(C(R_8)_2)_m$; m ranges from each of the n $R_5$'s and n $R_6$'s is independently selected from the same or different leaving group and the same or different organofluoro moiety; $R_7$ is selected from a leaving group and an organofluoro moiety; and each of the 2n*m or fewer $R_8$'s is selected from F and the same or different organofluoro moiety.

The invention also provides a low dielectric constant fluorine and carbon-doped silicon oxide dielectric material for use in an integrated circuit structure, the dielectric material containing silicon atoms bonded to oxygen atoms, silicon atoms bonded to carbon atoms, and carbon atoms bonded to fluorine atoms, where the dielectric material is characterized by the presence of at least one C—C bond. Also provided is a low dielectric constant fluorine and carbon-doped silicon oxide dielectric material for use in an integrated circuit structure containing silicon atoms bonded to oxygen atoms, silicon atoms bonded to carbon atoms, and carbon atoms bonded to fluorine atoms, where the dielectric material contains carbon atoms bonded to from 1 to 2 fluorine atoms. Further provided is a low dielectric constant fluorine and carbon-doped silicon oxide dielectric material for use in an integrated circuit structure containing silicon atoms bonded to oxygen atoms, silicon atoms bonded to carbon atoms, and carbon atoms bonded to fluorine atoms, where the dielectric material contains at least one silicon atom bonded to from 0 to 2 oxygen atoms.

The low k fluorine and carbon-containing silicon oxide dielectric material formed in the method of the invention will have a resultant low dielectric constant relative to silicon oxide or silicon nitride dielectric materials, and will have an increased resistance to oxidation relative to traditional carbon-containing silicon oxide dielectric materials, which contain a large number of oxidant-sensitive aliphatic C—H bonds.

As used herein, an "organofluoro silane" is a compound that contains at least one silicon atom bonded to at least one carbon atom and at least one carbon atom bonded to at least one fluorine atom. Similarly, an "organofluoro moiety" is a moiety that contains at least one carbon atom bonded to at least one fluorine atom.

Use herein of the term "silanes" refers to silicon-containing compounds containing at least one silicon atom bonded to at least one hydrogen atom or bonded to at least one carbon atom. Exemplary silanes include $SiH_4$, $SiH_3(CH_3)$, and $SiH_3(CF_3)$.

By use of the interchangeable terms "low k" or "low dielectric constant" herein is meant a dielectric constant below the dielectric constant of silicon oxide or silicon nitride. Preferably, a low dielectric constant is a dielectric constant below about 3.5, and more preferably below about 3.

The term "aliphatic C—H bond" refers to a C—H bond where the carbon atom bonded to the hydrogen atom is not in an aromatic ring; thus, "aliphatic C—H bond", as used herein, includes alicyclic C—H bonds. Similarly, an "aliphatic hydrogen" is a hydrogen atom bound to a carbon through an aliphatic C—H bond.

The term "oxidizing agent" refers to an oxygen-containing compound capable of reacting with an organofluoro silane to form one or more Si—O bonds. Exemplary oxidizing agents include hydrogen peroxide, ozone ($O_3$), oxygen ($O_2$), oxides of nitrogen ($N_2O$, NO, $NO_2$), and mixtures thereof. Typically an oxidizing agent used in the method of the invention will selectively react with C—F bonds less readily than aliphatic C—H bonds.

By use of the term "mild oxidizing agent" is meant an oxidizing agent, such as a peroxide, capable of oxidizing an organofluoro silane reactant at a low temperature, and which will not oxidize sufficiently vigorously to cause the Si—C bonds to break in preference to Si—H bonds, since cleavage of Si—C bonds can interfere with the film-forming capabilities of the reaction product. Typically, a mild oxidizing agent will cause cleavage of Si—H bonds in preference to Si—C bonds. An exemplary mild oxidation agent is hydrogen peroxide.

The term "strong oxidizing agent" means an oxidizing agent capable of forming Si—O bonds more readily than hydrogen peroxide. Exemplary strong oxidizing agents include ozone ($O_3$), oxygen ($O_2$), oxides of nitrogen ($N_2O$, NO, $NO_2$), and mixtures thereof.

The term "silicon-bonded moiety" as used herein refers to an atom or group of atoms, containing at least one atom bonded to a silicon atom.

By use of the term "low temperature" herein is meant a temperature not exceeding about 25° C., preferably not exceeding about 10° C., and most preferably not exceeding about 5° C. Typically, this temperature will be measured by reference to the temperature of the substrate support.

The term "link" and grammatic variants thereof, as used herein refers to an atom or moiety that is bonded to two adjacent atoms. For example, an oxygen atom that links two silicon atoms will be bonded to two silicon atoms as follows: Si—O—Si. Similarly, exemplary organofluoro moieties that link two silicon atoms will be bonded to two silicon atoms as follows: Si—$CF_2$—Si, Si—$CF_2$—$CF_2$—Si, and the like.

The term "leaving group" as used herein refers to a silicon-bonded moiety that undergoes oxidizing agent-mediated cleavage from a silicon atom more readily than a moiety having the formula $C_xF_{2x+1}$, where x=1 to 5. Preferably, a leaving group undergoes oxidizing agent-mediated cleavage from a silicon atom more readily than a $CF_3$ moiety. Exemplary leaving groups include H, organo moieties such as alkyl moieties, and oxyorgano moieties. As used herein, an "oxyorgano moiety" refers to a carbon and oxygen-containing moiety where an oxygen atom of the moiety is bonded to a silicon atom. Exemplary oxyorgano moieties include —$OCH_3$ and —$OCH_2CH_3$.

As used herein, "alkyl" (where no carbon range is specified) refers to a 1 to 5 carbon saturated hydrocarbon moiety bonded to a silicon atom through a carbon atom.

By use of the term "primary hydrogen" herein is meant hydrogen atoms bonded in multiples of three to a single carbon atom which is bonded to only one other non-hydrogen atom; in contrast to secondary hydrogens which are bonded in multiples of two to a carbon atom which is bonded to two other non-hydrogen atoms, and to tertiary hydrogens which are bonded in multiples of one to a carbon atom which is bonded to three non-hydrogen atoms. Examples of primary, secondary and tertiary hydrogens, respectively, are (in bold): Si—$CH_3$, Si—$CH_2$—$CH_3$, and Si—CH—$(CH_3)_2$.

Organofluoro Silane

An organofluoro silane used in the method of the invention will be a compound of the group having the formula $SiR_1R_2R_3R_4$, according to the formula defined above.

$R_1$

The silicon atom of the above organofluoro silane formula will be bonded to an $R_1$ group, which is selected from H, a 3 to 5 carbon organo moiety, and an oxyorgano moiety.

Typically, the $R_1$ group will participate in the oxidation reaction of the process of the invention. Accordingly, during the process of the invention, the $R_1$ group will typically be replaced by an oxygen atom linking two silicon atoms in the low k fluorine and carbon-containing silicon oxide dielectric material produced by the process of the invention. Where $R_1$ is H, and, preferably where at least one of $R_3$ or $R_4$ is also H, the process of the invention can be carried out using a mild oxidizing agent or a strong oxidizing agent. In one embodiment, a mild oxidizing agent is used at low temperature in a process with excellent gap-filling properties.

Where $R_1$ is a 3 to 5 carbon organo moiety, $R_1$ will often be a saturated alkyl and contain more secondary hydrogen atoms than primary hydrogen atoms. While not intending to be limited by the following theory, it is thought that secondary hydrogen atoms are more susceptible to oxidation relative to primary hydrogen atoms. This susceptibility to oxidation is described in detail in U.S. Pat. No. 6,303,047, issued Oct. 16, 2001, which is incorporated herein by reference. Accordingly, when $R_1$ contains more secondary hydrogen atoms than primary hydrogen atoms, $R_1$ may have an increased propensity for cleavage when reacted with an oxidizing agent in the process of the invention. When $R_1$ is a saturated alkyl, $R_1$ has more secondary hydrogens than primary hydrogens when $R_1$ contains 3 or more carbon atoms (e.g., a —$CH_2$—$CH_2$—$CH_3$ moiety has four secondary hydrogens and three primary hydrogens). Similarly, tertiary hydrogens are considered to be more sensitive to oxidation than are secondary hydrogens. Accordingly, in one embodiment it may be desirable for $R_1$ to contain at least one tertiary hydrogen (e.g., —CH—$(CH_3)_2$).

The oxidizing agent and reaction conditions of the process of the invention used when $R_1$ is an alkyl or a substituted alkyl will be selected according to the oxidation sensitivity of $R_1$. When $R_1$ is very sensitive to oxidation (e.g., $R_1$ is hydrogen), the process of the invention can be carried out using a mild oxidizing agent at low temperature. When $R_1$ is less sensitive to oxidation (e.g., $R_1$ is an alkyl), the selected oxidizing agent can be a strong oxidizing agent, and the temperature can be increased during the oxidation or a plasma enhanced oxidation can be carried out. While the sensitivity to oxidation of $R_1$ can be an important factor in the selection of oxidizing agent and reaction conditions, such selections can also be influenced by other moieties bonded to the silicon atom of the above formula.

Where $R_1$ is an oxyorgano moiety, the oxygen atom will be bonded to the silicon atom. While not intending to be limited to the following theory, carrying out the process of the invention by reacting oxyorgano moieties bonded to silicon with a strong oxidizing agent at high temperature may result in simpler and more direct reaction pathways leading to the formation of the low k fluorine and carbon-containing silicon oxide dielectric material product relative to the more complex and indirect reaction pathways associated with use of organo moieties such as alkyl moieties.

$R_2$

The silicon atom of the above organofluoro silane formula will also be bonded to an organofluoro moiety ($R_2$) containing at least one carbon atom bonded to at least one fluorine atom. This $R_2$ organofluoro moiety will typically be characterized by the absence of aliphatic C—H bonds (i.e., the absence of aliphatic hydrogens), since aliphatic C—H bonds can be more readily oxidized than C—F bonds. Preferably, the organofluoro moiety will consist essentially of: (1) one or more carbon atoms; and (2) one or more fluorine atoms. For example, the organofluoro moiety can be a saturated fluorocarbon having the general formula $C_xF_{2x+1}$, where x ranges from 1 to 5; for example, —$CF_3$, —$CF_2CF_3$, —$CF(CF_3)_2$, —$CF_2CF_3$, —$CF_2CF_2CF_2CF_3$, —$CF_2CF(CF_3)_2$, —$C(CF)_3$, and the like. The number of carbon atoms in the organofluoro moiety can range from 1 to 5, though the number of carbon atoms preferably ranges from 1 to 4, more preferably ranges from 1 to 3, most preferably ranges from 1 to 2, and typically is 1.

In another embodiment, the organofluoro moiety of $R_2$ contains 2 or more carbon atoms. When the organofluoro moiety contains 2 or more carbon atoms, the moiety will contain at least one carbon atom that is bonded to both another carbon atom and to a fluorine atom as follows: C—C—F. Further, a organofluoro moiety containing 2 or more carbon atoms will typically contain one or more carbons that are bonded to from 1 to 2 fluorine atoms. For example, $CF(CF_3)_2$ contains a carbon atom bonded to only one fluorine atom, and $CF_2CF_3$ contains a carbon atom bonded to only two fluorine atoms.

Alternatively, an organofluoro moiety can contain one or more aromatic rings, so long as it also contains at least one carbon atom bonded to a fluorine atom. In one such case, the carbon atom bonded to the fluorine atom is an aliphatic carbon. For example, organofluoro moieties having one or more aromatic rings can include —Ph—$CF_3$, —$CF_2$—Ph, —$CF_2$—Ph—$CF_3$, and the like, where Ph is a six carbon aromatic ring. Since aromatic C—H bonds are more resistant to oxidation relative to aliphatic C—H bonds, the aromatic C—H bond will not be readily oxidized by the oxidizing agent used in the method of the invention. Similarly, an organofluoro silane may contain an aromatic moiety bound to silicon which aromatic moiety does not contain fluorine atoms, so long as at least one other silicon-bonded moiety of the organofluoro silane contains at least one carbon atom bonded to at least one fluorine atom.

$R_3$ and $R_4$

The balance of the moieties bonded to the silicon atom of the above formula are selected from: the same or different leaving group, the same or different organofluoro moiety, and the same or different $((L)Si(R_5)(R_6))_n(R_7)$, as defined below. When either $R_3$, $R_4$, or both $R_3$ and $R_4$ are leaving groups, these moieties can be used to react with the oxidizing agent in the process of the invention, as discussed above in regard to $R_1$. While $R_1$, $R_3$ and $R_4$ can be identical, such is not required. For example, it may be that $R_1$ is desired to be more sensitive to oxidation than $R_3$ or $R_4$; in such an instance, $R_1$ can be, for example, H, while $R_3$ and $R_4$ can be, for example, both alkyls, or an H and an alkyl. Accordingly, neither $R_3$ nor $R_4$ is required to have more secondary hydrogens than primary hydrogens, and, thus each can be 1 to 5 carbon organo moiety such as a 1 to 5 carbon alkyl. In one embodiment, at least one of $R_3$ and $R_4$ is H.

When either $R_3$, $R_4$, or both $R_3$ and $R_4$ contain at least one carbon atom bonded to at least one F atom, such will be a organofluoro moiety or moieties as described above for $R_2$.

$R_3$, $R_4$, or both, can also be $((L)Si(R_5)(R_6))_n(R_7)$, where: n ranges from 1 to 5; L is O or $(C(R_8)_2)_m$; m=1 to 4; each of the n $R_5$'s and n $R_6$'s is independently selected from the same or different leaving group and the same or different organofluoro moiety; $R_7$ is selected from a leaving group and an organofluoro moiety; and each of the 2n*m or fewer $R_8$'s is selected from F and the same or different organofluoro moiety. As used herein, "*" represents the mathematical multiplication function. Thus, n*m represents n multipled by m. For example, if n is 2 and m is 3, n*m is 2 multiplied by 3, which equals 6.

When either $R_3$ or $R_4$ is $((L)Si(R_5)(R_6))_n(R_7)$, the organofluoro silane will contain at least two silicon atoms linked by either an oxygen atom or one or more carbon atoms. When the two silicon atoms are linked by one or more carbon atoms, the linking carbon atom(s) are also bonded to one or more fluorine atoms, or to one or more organofluoro moieties, or to a combination thereof. The number of carbon atoms linking two silicon atoms can range from 1 to 4 carbon atoms, preferably 1 to 3 carbon atoms, more preferably from 1 to 2 carbon atoms, and typically is 1 carbon atom. While such an organofluoro silane contains two silicon atoms, this compound can further contain additional silicon atoms. For example, an organofluoro silane can contain from 2 to 6 silicon atoms, preferably from 2 to 4 silicon atoms, more preferably from 2 to 3 silicon atoms. Typically such an organofluoro silane will contain 2 silicon atoms. It is within the scope of the invention that an organofluoro silane containing three or more silicon atoms can contain one or more oxygen atoms linking silicon atoms while also containing one or more carbon atoms linking silicon atoms. For example, an organofluoro silane can contain an oxygen atom linking a first set of two silicon atoms while also containing a carbon atom linking a second set of two silicon atoms, shown as: Si—O—Si—C—Si. Typically however, an organofluoro silane will contain only oxygen atoms linking silicon atoms or only carbon atoms linking silicon atoms.

The use of a multiple-silicon atom-containing compound in the method of the invention will permit incorporation of a greater variety of organofluoro moieties, including organofluoro silanes containing two silicon atoms linked by one or more carbon atoms. Use of these organofluoro silanes will permit enhanced control of the number of fluorine and carbon atoms incorporated into the final low k silicon oxide dielectric material produced using the method of the invention.

Compound—Overall

In one embodiment of the invention, the process of the invention utilizes organofluoro silanes having few or no aliphatic hydrogen atoms. For example, a compound such as $SiH_2(CH_3)(CF_3)$ contains one silicon atom, three fluorine atoms, and three aliphatic hydrogens; and $SiH_2(Ph)(CF_3)$ contains no aliphatic hydrogens. Other exemplary compounds having few aliphatic hydrocarbons include $SiH(CH_3)_2CF_3$, $SiH_2(OCH_3)CF_3$, $SiH(OCH_3)_2CF_3$, $SiH(CH_3)_2(CF_3)OSiH(CH_3)_2(CF_3)$, and the like. Typically, such organofluoro silanes having few or no aliphatic hydrogens contain at least 1 silicon atom per 8 aliphatic hydrogen atoms. Alternatively, such organofluoro silanes contain at least 3 fluorine atoms per 8 aliphatic hydrogen atoms.

In another embodiment, the organofluoro silane has a relatively large number of fluorine atoms. For example, the organofluoro silane can contain at least one fluorine atom per carbon atom. In another example, the organofluoro silane can contain at least four fluorine atoms per silicon atom. An exemplary compound that has at least one fluorine atom per carbon atom is $(CH_3)_2(CF_3)SiOSi(CH_3)_2(CF_3)$; and an exemplary compound that has at least four fluorine atoms per silicon atom is $SiH(CH_3)_2(CF_2CF_3)$.

In another embodiment, an organofluoro silane will consist essentially of: one or more silicon atoms; one or more carbon atoms; one or more fluorine atoms; one or more hydrogen atoms, where the hydrogen atoms are bonded only to silicon atoms; and, optionally, one or more oxygen atoms bonded to silicon atoms.

In one embodiment, it is desirable that some carbon atoms be incorporated into the backbone of the polymer product (the low k dielectric material) to enhance the thermal conductivity of the resultant dielectric film. Thus a silicon oxide containing fluorine and carbon atoms may have, for example, the structure:

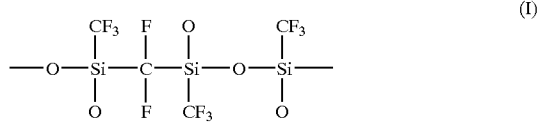

where one or more carbon atoms are incorporated into the silicon/oxygen chain. Such materials can be formed, for example, using organofluoro silanes having a —$CF_2$— linking two silicon atoms. For example, the organofluoro silane used to form the material of structure I can be $H_2CF_3SiCF_2SiCF_3H_2$.

Oxidizing Agent

The oxidizing agent used in the method of the invention can be any oxygen-containing compound capable of reacting with an organofluoro silane to form a Si—O bond. For particular reactions, the oxidizing agent will be capable of reacting with a Si—H bond in forming the Si—O bond. The oxidizing agent will selectively react with aliphatic C—H bonds more readily than with C—F bonds. Exemplary oxidizing agents capable of such reactions include hydrogen peroxide, oxygen, ozone, and oxides of nitrogen ($N_2O$, NO, $NO_2$). Preferably, the oxidizing agent selectively cleaves Si—H bonds and aliphatic C—H bonds in preference over Si—O bonds, or C—F bonds. In one embodiment, the oxidizing agent also selectively cleaves Si—H bonds in preference over cleaving aromatic C—H bonds.

In another embodiment, an oxidizing agent for use in the method of the invention is a mild oxidizing agent, for example, hydrogen peroxide. A mild oxidizing agent reactant preferably comprises a vaporous source of peroxide. Such a peroxide can be conveniently obtained by flash evaporation of concentrated (30 vol. % or more) liquid hydrogen peroxide. By the term "source of peroxide" is meant any material capable of being heated (such as liquid hydrogen peroxide), or decomposed and heated (such as calcium peroxide or barium peroxide), to provide a vaporous hydrogen peroxide ($H_2O_2$) typically be selected as an oxidizing agent when an organofluoro silane used in the method of the invention contains Si—H bonds.

In contrast, when the organofluoro silane does not contain Si—H bonds or contains aliphatic C—H bonds, it may be desirable to use an oxidizing agent which is more reactive than hydrogen peroxide, for example, oxygen or ozone. In such instances it may further be desirable to carry out the oxidation reaction using a plasma enhanced chemical vapor deposition method.

Reaction Conditions

The organofluoro silane and the oxidizing agent can be reacted together by introducing them into a reaction chamber and carrying out chemical vapor deposition. For example, an organofluoro silane and hydrogen peroxide are introduced into a reaction chamber containing a cooled substrate support therein on which is mounted a semiconductor substrate such as a silicon substrate on which the reaction product will deposit. For such a reaction, the reaction chamber is advantageously maintained at a pressure of from about 0.1 Torr to about 50 Torr, preferably from about 1 Torr to about 10 Torr, and most preferably from about 1 Torr to about 5 Torr. Both the organofluoro silane and the hydrogen peroxide are introduced into the chamber in a gaseous or vaporous phase. The delivery system for the reactants is preferably maintained at a temperature which ensures delivery of the reactants into the chamber as gases or vapors, typically from about 70° C. to about 100° C. Flow rates of the individual reactants will depend upon chamber size and will also vary with the particular reactants. During the reaction and deposition, the temperature of the substrate support in the reaction chamber is maintained at a low temperature not exceeding about 25° C., preferably not exceeding about 10° C., and most preferably not exceeding about 5° C. The reaction and deposition is carried out for a period of time sufficient to form the layer of low k fluorine and carbon-containing silicon oxide dielectric material to the desired thickness over the integrated circuit structure already formed on the silicon substrate. Usually this thickness will range from a minimum of about 300 nm to ensure sufficient electrical insulation between underlying conductive regions and conductive regions to be formed over the low k dielectric material up to a maximum of about 800 nm or more. Thicker layers can be formed, but are deemed unnecessary and merely add to the bulk of the structure. Such a reaction method forms a low k film having excellent via-filling properties, yields a dielectric layer with low adhesion stress, and can be preferable when using silane compounds that, under particular conditions, can be oxidized by mild oxidizing agents such as peroxide.

In another embodiment, the organofluoro silane and oxidizing agent reactants can be reacted together by introducing gaseous or vaporous organofluoro silane or an organofluoro silane-containing mixture and a strong oxidizing agent into a chamber at about 40 Torr to about 1000 Torr, preferably from about 700 Torr to about 800 Torr. The reaction can then be carried out at a temperature from about 250° C. to about 450° C., preferably from about 250° C. to about 400° C., and typically about 350° C. The strong oxidizing agent used in the reaction can be any oxygen-containing reagent capable of reacting with an organofluoro silane to form a low k fluorine and carbon-containing silicon oxide dielectric material, such as ozone ($O_3$), oxygen ($O_2$), oxides of nitrogen ($N_2O$, NO, $NO_2$), and the like. The reaction and deposition is carried out for a period of time sufficient to form the layer of low k fluorine and carbon-containing silicon oxide dielectric material to the desired thickness over the integrated circuit structure already formed on the silicon substrate. Usually this thickness will range from a minimum of about 300 nm to ensure sufficient electrical insulation between underlying conductive regions and conductive regions to be formed over the low k dielectric material up to a maximum of about 800 nm or more.

In yet another embodiment, a plasma-enhanced chemical vapor deposition (PECVD) can be carried out. A plasma-activated strong oxidizing agent and a gaseous or vaporous organofluoro silane or an organofluoro silane-containing mixture and a carrier gas such as helium can be introduced into a chamber at about 1 Torr to about 40 Torr, preferably from about 5 Torr to about 20 Torr. The reaction can then be carried out at a temperature from about 50° C. to about 450° C., preferably from about 200° C. to about 300° C., and typically about 250° C. The strong oxidizing agent used in the reaction can be any oxygen-containing reagent capable of reacting with an organofluoro silane to form a low k fluorine and carbon-containing silicon oxide dielectric material, such as ozone ($O_3$), oxygen ($O_2$), oxides of nitrogen ($N_2O$, NO, $NO_2$), and the like. Typically, the strong oxidizing agent will be oxygen. The reaction and deposition is carried out for a period of time sufficient to form the layer of low k fluorine and carbon-containing silicon oxide dielectric material to the desired thickness over the integrated circuit structure already formed on the silicon substrate. Usually this thickness will range from a minimum of about 300 nm to ensure sufficient electrical insulation between underlying conductive regions and conductive regions to be formed over the low k dielectric material up to a maximum of about 800 nm or more.

The choice of reaction protocol to be used in the method of the invention can be based on any of a variety of factors, for example: physical properties of the deposited film such as film stress; thermal budget of the integrated circuit structure; desired speed and efficiency of the oxidation reaction; and the like. The choice of reaction to be used can particularly be influenced by the nature of the organofluoro silane compound used in the method of the invention. For example, when an organofluoro silane has as leaving groups solely hydrogen atoms, the low temperature, mild oxidizing agent oxidation reaction will typically be preferred to a strong oxidizing agent oxidation reaction. However, when an organofluoro silane has as leaving groups solely organo or oxyorgano moieties, the low temperature, mild oxidizing agent oxidation reaction will not typically result in complete oxidation of the organofluoro silane; therefore, use of a strong oxidizing agent in a high temperature CVD or PE-CVD reaction will be preferable. For those organofluoro silanes having both hydrogen atoms and organo or oxyorgano moieties as leaving groups, the preferred oxidation method will be selected based on the quantity of a particular type of leaving group that is present in the organofluoro silane relative to the quantity of silicon atoms present. For example, when there are present two or more organo or oxyorgano leaving groups, or a combination thereof, per silicon atom in an organofluoro silane, an oxidation reaction using a strong oxidizing agent will be preferred. In other instances, particularly when there are present two or more hydrogen atoms per silicon atom, the low temperature, mild oxidizing agent oxidation reaction will be preferred.

While not intending to be limited to the following theory, it is thought that, as the polymer forms, bonds of the organofluoro moieties to the silicon atoms of the silicon oxide polymer will not be oxidized as readily as bonds of unsubstituted alkyl moieties to the silicon atoms of the silicon oxide polymer. Furthermore, the dielectric constant of the resulting dielectric material having fluorocarbon groups substituted for alkyl groups should not be adversely affected by the higher polarizability of the fluorocarbon groups because of the higher volume of the fluorocarbon group over the alkyl group, since the dielectric constant is obtained by dividing the polarizability ($\alpha$) by the volume (v) in the formula $k=\alpha/v$ and increases in polarizability tend to be canceled out by increases in volume.

Silane Mixtures

While the product of the process invention principally comprises a low dielectric constant (low k) silicon oxide dielectric material containing organofluoro groups, it is within the scope of the invention to utilize, in the process of the invention, mixtures of the organofluoro silanes with non-fluoro silanes, including $SiH_4$. Such materials can be blended with one or more of the above-described organofluoro silanes to enhance other physical properties of the resultant film of low k dielectric material. Exemplary physical properties include dielectric constant, adhesion capabilities, via filling capabilities, surface stress, and the like.

For example, to enhance the film forming properties of the low dielectric constant fluorine and carbon-containing silicon oxide dielectric material of the invention, one or more organofluoro silanes can be blended with one or more of the following non-fluoro silanes:
 a) silanes having no silicon atoms bonded to carbon-containing groups;
 b) organo silanes containing silicon atoms bonded to one or more carbon-containing groups having aliphatic C—H bonds (such as methyl silane used in the Trikon Flowfill process);
 c) organo silanes that do not contain aliphatic C—H bonds, such as organo silanes containing a silicon atom bonded to an aromatic carbon group; and
 d) mixtures of any two or more of a), b), and c).

Such a mixture of silanes which includes one or more organofluoro silanes may be reacted, for example, with hydrogen peroxide ($H_2O_2$) in forming a low k fluorine and carbon-containing silicon oxide dielectric material. For example, a mixture of silanes corresponding to mixture a) above could contain a mixture of silane ($SiH_4$) and an organofluoro silane having the formula $SiR_1R_2R_3R_4$ where $R_1$ is H, $R_2$ and $R_3$ are $CF_3$, and $R_4$ is $CH_3$. A mixture of silane corresponding to mixture b) could contain methyl silane combined with the organofluoro silane $SiR_1R_2R_3R_4$ where $R_1$ is H, $R_2$ and $R_3$ are $CF_3$, and $R_4$ is $CH_3$. To form a mixture including both a) and b), one could use both silane and methyl silane in combination with the organofluoro silane having the formula $SiR_1R_2R_3R_4$ where $R_1$ is H, $R_2$ and $R_3$ are $CF_3$, and $R_4$ is $CH_3$. Other examples of substituted silanes which can be used either singly or in combination to form mixtures of silanes containing organofluoro silanes include dimethyl silane, ethyl silane, isopropyl (1-methylethyl) silane, n-butyl silane, isobutyl (2-methyl propyl) silane, phenyl silane, and methylenebis-silane.

As stated above, the amount of such silanes which may be combined with one or more organofluoro silanes in the method of the invention will typically be combined as minor components. By use of the term "minor component" is meant that the one or more non-fluorosilanes used in a mixture of silanes will comprise less than 50 volume % of the total volume of the compounds in the mixture, ensuring that the major component of the mixture comprises one or more organofluoro silanes. However, it is recognized that in some instances the enhancement of other properties of the resulting mixture, e.g., the film forming properties, may justify the use of more that 50 volume % of other silanes, that is, up to about 70 volume % of other silanes and 30 volume % of one or more organofluoro silanes, even though such usage may raise the dielectric constant of the resulting dielectric material.

When using such mixtures the average dielectric constant of the dielectric material formed using a mixture of silanes can be determined for the particular proportions of such dielectric materials using the formula:

$$k_{av} = \Sigma_i x_i k_i$$

where $x_i$ is the volume fraction of dielectric component i and $k_i$ is the dielectric constant of the pure dielectric component. Thus, for example, dielectric materials (a) and (b) might be added to the low dielectric constant fluorine and carbon-containing silicon oxide dielectric material of the invention to enhance the film forming properties of the resulting mixture. If a mixture is formed comprising 10 volume % of dielectric material (a), 15 volume % of dielectric material (b), and 75 volume % of the low dielectric constant fluorine and carbon-containing silicon oxide dielectric material, the average dielectric constant of the mixture will comprise the sum of the products of the dielectric constant of each of the materials times its volume % in the mixture. If the dielectric constant of the low dielectric constant fluorine and carbon-containing silicon oxide dielectric material is 2.4, the dielectric constant of dielectric material (a) is 3.5, and the dielectric constant of dielectric material (b) is 3.4, the average dielectric constant $k_{av}$ would equal (2.4×0.75)+(3.5×0.10)+(3.4×0.15)=2.7.

In Combination with Other Layers

While the low k fluorine and carbon-containing silicon oxide dielectric material formed in the method of the invention will have increased oxidation resistance relative to carbon-doped silicon oxide dielectric material, it may be desirable to form a thin conventional (standard k) silicon oxide ($SiO_2$) or silicon nitride base layer over the substrate to act as a moisture barrier layer for such low k fluorine and carbon-containing silicon oxide dielectric material subsequently formed thereon. A similar moisture barrier layer may also be formed over such a low k fluorine and carbon-containing silicon oxide dielectric layer for the same reasons. Such a barrier layer adjacent the layer of low k fluorine and carbon-containing silicon oxide dielectric material can be formed to a thickness of about 50 nanometers (nm) to provide adequate protection (if deemed necessary) for the low k fluorine and carbon-containing silicon oxide dielectric layer to be formed thereon. Thicknesses exceeding this minimum may be used, but are probably unnecessary and may negatively contribute to an undesired rise in the overall dielectric constant of the resulting composite layer. Such barrier layers may then serve to protect the low k dielectric material during subsequent processing steps.

In another embodiment, deposition of the low k fluorine and carbon-containing silicon oxide dielectric material does not result in 100% filling of the via, for example, when the deposition is carried out using a strong oxidizing agent. In this instance, a subsequent step with superior gap-filling properties, such as deposition using hydrogen peroxide, can be used to fill any void remaining after the deposition with the strong oxidizing agent. The silane used in the hydrogen peroxide oxidation step can be $SiH_4$, or can be an organo silane, an organofluoro silane, or any other dielectric material useful for filling voids in vias.

Similarly, the low k fluorine and carbon-containing silicon oxide dielectric material formed in the method of the invention may find utility, for example, as one or more of the low k dielectric layers described in U.S. Pat. Nos. 6,423,628, issued Jul. 23, 2002; 6,232,658, issued May 15, 2001; 6,391,795, issued May 21, 2002; 6,492,731, issued Dec. 10, 2002; 6,350,700, issued Feb. 26, 2002; 6,423,630, issued Jul. 23, 2002; and 6,537,923, issued Mar. 25, 2003; and 6,756,674, issued Jun. 29, 2004; all assigned to the assignee of this invention.

Product—Dielectric Material

The low dielectric constant fluorine and carbon-containing silicon oxide dielectric material produced by the method of the invention will be suitable for use in integrated circuit structures. This fluorine and carbon-containing silicon oxide dielectric material will contain silicon atoms bonded to oxygen atoms, silicon atoms bonded to carbon atoms, and carbon atoms bonded to fluorine atoms. In one embodiment of the invention, the fluorine and carbon-containing silicon oxide dielectric material will be characterized by the absence of aliphatic C—H bonds. A fluorine and carbon-containing silicon oxide dielectric material produced by the method of the invention will have a dielectric constant below the dielectric constant of silicon oxide or silicon nitride. Preferably, the dielectric constant of the fluorine and carbon-containing silicon oxide dielectric material will be below about 3.5, more preferably below about 3.

Additionally, the fluorine and carbon-containing silicon oxide dielectric material will demonstrate superior resistance to degradation in subsequent processing steps such as, for example, via etch and photoresist removal steps. While not wishing to be limited by a particular theory, it is considered that organofluoro compounds, particularly those that do not contain aliphatic C—H bonds will have an increased resistance to oxidation. This resistance will decrease the susceptibility of the fluorine and carbon-containing silicon oxide dielectric material to physical degradation which can occur in a variety of manners, such as thermal instability, solvent absorption, and the like. Thus, the oxidation-resistant fluorine and carbon-containing silicon oxide dielectric material will typically contain more Si atoms than aliphatic C—H bonds.

In one embodiment, the fluorine and carbon-containing silicon oxide dielectric material will contain as principal components only silicon atoms, carbon atoms, fluorine atoms, and oxygen atoms. Such a fluorine and carbon-containing silicon oxide dielectric material will not contain a significant number of hydrogen atoms, and, consequently, will not contain a significant number of bonds susceptible to oxidation during deposition or subsequent processing steps.

In another embodiment, the fluorine and carbon-containing silicon oxide dielectric material will have a ratio of carbon atoms to silicon atoms of C:Si greater than about 1:3. As described above, the introduction of carbon atoms into a dielectric material has been useful for lowering the dielectric constant of silicon oxide dielectric materials. By introducing a greater ratio of carbon atoms to silicon atoms, the dielectric constant can be lowered even further. A particular choice of C:Si ratio will depend not only upon the desired dielectric constant, but also upon other desired physical properties of the dielectric material. Thus, a desired C:Si ratio can be greater than about 2:3, greater than about 1:1 or greater than about 3:2.

Because several components can be combined in a silane mixture used to form the fluorine and carbon-containing silicon oxide dielectric material, some silicon atoms may not be bonded to any carbon atoms, while some carbon atoms may be bonded solely to other carbon atoms and other fluorine atoms. For example, a silane mixture can contain $SiH_4$ and $H(CH_3)(CF_2CF_3)SiOSiH(CH_3)(CF_2CF_3)$; in this example, the ratio of C:Si will be a function of the ratio of $H(CH_3)(CF_2CF_3)SiOSiH(CH_3)(CF_2CF_3)$ to $SiH_4$ in the silane mixture. The C:Si ratio will usually be greater than about 1:3, preferably greater than about 2:3, more preferably greater than about 1:1, and most preferably greater than about 3:2. Regardless, such a dielectric material will be characterized by the presence of C—C bonds, and typically, at least one of the carbons participating in a C—C bond will be bound to one or more fluorine atoms.

In yet another embodiment of the invention, the fluorine and carbon-containing silicon oxide dielectric material will contain at least one pair of silicon atoms linked by one or more carbon atoms. Preferably, at least 1% of the silicon atoms will be linked by one or more carbon atoms, more preferably at least 10% of the silicon atoms will be linked by one or more carbon atoms. Typically, such a carbon atom will also be bonded to: (a) one or more fluorine atoms; (b) one or more organofluoro moieties; (c) or a combination thereof. As discussed above, in some instances preferred thermal properties can result when carbon atoms are incorporated into the backbone of the dielectric material formed in the process of the invention. Further, it is desirable to have a relatively large number of fluorine atoms in the dielectric material formed by the process of the invention. Such a dielectric material will typically be formed by the above-described process of the invention where the process includes reacting with an oxidizing agent an organofluoro silane containing two silicon atoms linked by one or more carbon atoms.

Similarly, in another embodiment, a fluorine and carbon-containing silicon oxide dielectric material of the invention contains at least 3 fluorine atoms per silicon atom, and preferably, at least 4 fluorine atoms per silicon atom.

In yet another embodiment of the invention, the fluorine and carbon-containing silicon oxide dielectric material will contain at least one silicon atom bonded to no more than 2 oxygen atoms. Preferably, at least 1% of the silicon atoms will be bonded to no more than 2 oxygen atoms, more preferably at least 10% of the silicon atoms will be bonded to no more than 2 oxygen atoms. These silicon atoms will be bonded to carbon atoms that link silicon atoms or to organofluoro moieties such as those described above for $R_2$. Preferably, each silicon atom in the fluorine and carbon-containing silicon oxide dielectric material is bonded to at least 1 oxygen atom. As with the above embodiment, such a dielectric material of the invention can contain at least 3 fluorine atoms per silicon atoms, and preferably, at least 4 fluorine atoms per silicon atom.

In yet another embodiment of the invention, the fluorine and carbon-containing silicon oxide dielectric material will contain at least one silicon atom bonded to no more than 2 oxygen atoms. Preferably, at least 1% of the silicon atoms will be bonded to no more than 2 oxygen atoms, more preferably at least 10% of the silicon atoms will be bonded to no more than 2 oxygen atoms. These silicon atoms will be bonded to carbon atoms that link silicon atoms or to organofluoro moieties such as those described above for $R_2$. Preferably, each silicon atom in the fluorine and carbon-containing silicon oxide dielectric material is bonded to at least 1 oxygen atom. As with the above embodiment, such a dielectric material of the invention can contain at least 3 fluorine atoms per silicon atom, and preferably, at least 4 fluorine atoms per silicon atom.

In a further embodiment of the invention, the fluorine and carbon-containing silicon oxide dielectric material will contain at least one C—C bond. Preferably, at least 1% of the carbon atoms will be bonded to one or more other carbon atoms, more preferably at least 10% of the carbon atoms will be bonded to one or more other carbon atoms. These carbon atoms will typically be included in the organofluoro moieties bonded to silicon atoms in the dielectric material. Accordingly, at least one of the two carbons participating in the C—C bond will further be bonded to one or more fluorine atoms. The presence of C—C bonds can be desirable for lowering the dielectric constant of the fluorine and carbon-containing silicon oxide dielectric material of the invention by increasing the number of carbon atoms per silicon atom and thereby reducing the overall dielectric constant of the dielectric material.

In a similar embodiment of the invention, the fluorine and carbon-containing silicon oxide dielectric material will contain at least one carbon atom bonded to from 1 to 2 fluorine atoms. Preferably, at least 1% of the carbon atoms will be bonded to from 1 to 2 fluorine atoms, more preferably at least 10% of the carbon atoms will be bonded to from 1 to 2 fluorine atoms. Such carbon atoms will typically be included in the organofluoro moieties bonded to silicon atoms in the dielectric material. As a result, the presence of carbon atoms bonded to from 1 to 2 fluorine atoms will typically imply the presence of more than one carbon atom in the organofluoro moiety. This can be desirable for lowering the dielectric constant of the fluorine and carbon-containing silicon oxide dielectric material of the invention by increasing the number of carbon atoms per silicon atom and thereby reducing the overall dielectric constant of the dielectric material.

Thus, the invention provides a low temperature process for forming a low k fluorine and carbon-containing silicon oxide dielectric material exhibiting superior resistance to oxidation than conventional carbon-doped low k silicon oxide dielectric materials while also providing good gap-filling capabilities and low stress adhesion not always found in other fluorine and carbon-containing silicon oxide dielectric materials.

The following examples serve to further illustrate the process of the invention.

EXAMPLE 1

The following example demonstrates the process of the invention in the formation of a low k fluorine and carbon-containing silicon oxide dielectric material at low temperature using the mild oxidizing agent, hydrogen peroxide.

Methyl-trifluoromethyl-silane $SiH_2(CH_3)(CF_3)$ and hydrogen peroxide can be introduced into a reaction chamber containing a cooled substrate support therein on which is mounted a silicon substrate on which the reaction product will deposit. The reaction chamber is advantageously maintained at a pressure of about 1–5 Torr. Both the methyl-trifluoromethyl-silane and the hydrogen peroxide are introduced into the chamber in a gaseous or vaporous phase. The delivery system for the reactants is maintained at about 100° C., which ensures delivery of the reactants into the chamber as gases or vapors. Flow rates of the individual reactants will depend upon chamber size and will also vary with the particular reactants. During the reaction and deposition, the temperature of the substrate support in the reaction chamber is maintained at a low temperature not exceeding about 0–10° C. The reaction and deposition is carried out for a period of time sufficient to form the layer of low k fluorine and carbon-containing silicon oxide dielectric material to the desired thickness over the integrated circuit structure already formed on the silicon substrate. Usually this thickness will be a minimum of about 300 nm to ensure sufficient electrical insulation between underlying conductive regions and conductive regions to be formed over the low k dielectric material. Such a reaction method forms a low k film having excellent via-filling properties, yields a dielectric layer with low adhesion stress.

EXAMPLE 2

The following example demonstrates the process of the invention in the formation of a low k fluorine and carbon-containing silicon oxide dielectric material using the strong oxidizing agent, ozone.

Di-methyl-di-trifluoromethyl-disiloxane $(CF_3)(CH_3)HSiOSiH(CH_3)(CF_3)$ and ozone can be introduced into a reaction chamber containing a silicon substrate on which the reaction product will deposit. The reaction chamber is advantageously maintained at a pressure of about 760 Torr. Both the di-methyl-di-trifluoromethyl-disiloxane and the ozone are introduced into the chamber in a gaseous or vaporous phase. Flow rates of the individual reactants will depend upon chamber size and will also vary with the particular reactants. During the reaction and deposition, the temperature of the substrate support in the reaction chamber is maintained at a temperature of about 350° C. The reaction and deposition is carried out for a period of time sufficient to form the layer of low k fluorine and carbon-containing silicon oxide dielectric material to the desired thickness over the integrated circuit structure already formed on the silicon substrate. Usually this thickness will be a minimum of about 300 nm to ensure sufficient electrical insulation between underlying conductive regions and conductive regions to be formed over the low k dielectric material.

While a specific embodiment of the process of the invention has been illustrated and described for carrying out the invention, modifications and changes of the apparatus, parameters, materials, etc. used in the process will become apparent to those skilled in the art, and it is intended to cover in the appended claims all such modifications and changes which come within the scope of the invention.

The invention claimed is:

1. A low dielectric constant fluorine and carbon-doped silicon oxide dielectric material for use in an integrated circuit structure comprising the reaction product of an oxidizing agent and one or more silanes comprising one or more organofluoro silanes having the formula $SiR_1R_2R_3R_4$, wherein:
   (a) $R_1$ is selected from the group consisting of H, a 3 to 5 carbon organo moiety, and an oxyorgano moiety;
   (b) $R_2$ is an organofluoro moiety; and
   (c) $R_3$ and $R_4$ are independently selected from the group consisting of the same or different leaving group, the same or different organofluoro moiety, and the same or different organofluoro moiety, and the same or different $((L)Si(R_5)(R_6))_n(R_7)$; wherein n ranges from 1 to 5; L is O or $(C(R_8)_2)m$; m ranges from 1 to 4; each of the n $R_5$'s and n $R_6$'s is independently selected from the group consisting of the same or different leaving group and the same or different organofluoro moiety; $R_7$ is selected from the group consisting of a leaving group and an organofluoro moiety; and each of the 2n*m or fewer $R_8$'s is selected from the group consisting of F and the same or different organofluoro moiety;
and further characterized by:
   (d) each silicon atom is bonded to at least 1 oxygen atom;
   (e) silicon atoms bonded to carbon atoms;
   (f) at least 1 carbon atom bonded to 1 to 2 fluorine atoms; and;
   (g) the presence of at least 1 C—C bond.

2. The low dielectric constant fluorine and carbon-doped silicon oxide dielectric material of claim 1 wherein said oxidizing agent comprises hydrogen peroxide.

3. The low dielectric constant fluorine and carbon-doped silicon oxide dielectric material of claim 1 wherein said $R_1$ comprises hydrogen.

4. The low dielectric constant fluorine and carbon-doped silicon oxide dielectric material of claim 1 wherein said $R_2$ comprises an organofluoro moiety containing $CF_3$.

5. The low dielectric constant fluorine and carbon-doped silicon oxide dielectric material of claim 1 wherein said $R_2$ consists essentially of C and F atoms.

6. The low dielectric constant fluorine and carbon-doped silicon oxide dielectric material of claim 1 wherein said $R_2$ consists essentially of C and F atoms alone.

7. The low dielectric constant fluorine and carbon-doped silicon oxide dielectric material of claim 1 wherein said $R_2$ consists essentially of C and F atoms and $R_3$ consists essentially of an alkyl.

8. The low dielectric constant fluorine and carbon-doped silicon oxide dielectric material of claim 1 wherein said $R_3$ contains $CH_3$ moieties.

9. The low dielectric constant fluorine and carbon-doped silicon oxide dielectric material of claim 1 wherein said $R_4$ comprises a leaving group.

10. The low dielectric constant fluorine and carbon-doped silicon oxide dielectric material of claim 1 wherein said $R_4$ comprises hydrogen.

11. A low dielectric constant fluorine and carbon-doped silicon oxide dielectric material for use in an integrated circuit structure and further characterized by:
   (a) each silicon atom is bonded to at least 1 oxygen atom;
   (b) silicon atoms bonded to carbon atoms;
   (c) at least 1 carbon atom bonded to 1 to 2 fluorine atoms; and
   (d) the presence of at least 1 C—C bond.

12. The low dielectric constant fluorine and carbon-doped silicon oxide dielectric material of claim 11 wherein at least one of the carbon atoms participating in said C—C bond is also bonded to at least one fluorine atom.

* * * * *